US012726209B2

(12) United States Patent
Sun et al.

(10) Patent No.: US 12,726,209 B2
(45) Date of Patent: Sep. 1, 2026

(54) DIGITAL-TO-ANALOG CONVERTER CALIBRATION SYSTEM

(71) Applicant: Analog Devices, Inc., Wilmington, MA (US)

(72) Inventors: Hyuk Sun, Burlington, MA (US); Gil Engel, Lexington, MA (US); Steven C. Rose, Woburn, MA (US); Paul S. Wilkins, Weston, MA (US); Kenneth A. Lawas, Kensington, NH (US); Bing Zhao, Englewood, CO (US); Andrew Porter Lewine, Andover, MA (US); Diane Marie Sutyak, Somerville, MA (US)

(73) Assignee: Analog Devices, Inc., Wilmington, MA (US)

( * ) Notice: Subject to any disclaimer, the term of this patent is extended or adjusted under 35 U.S.C. 154(b) by 127 days.

(21) Appl. No.: 18/658,789

(22) Filed: May 8, 2024

(65) Prior Publication Data

US 2025/0350292 A1 Nov. 13, 2025

(51) Int. Cl.
*H03M 1/10* (2006.01)

(52) U.S. Cl.
CPC .................................. *H03M 1/1014* (2013.01)

(58) Field of Classification Search
CPC .. H03M 1/1014; H03M 1/1061; H03M 1/687; H03M 1/745; H03M 1/1038
See application file for complete search history.

(56) References Cited

U.S. PATENT DOCUMENTS

| | | | | |
|---|---|---|---|---|
| 6,130,632 | A | 10/2000 | Opris | |
| 6,331,830 | B1 | 12/2001 | Song et al. | |
| 7,161,412 | B1 | 1/2007 | Manganaro | |
| 7,541,953 | B2 | 6/2009 | Chen et al. | |
| 8,031,098 | B1 * | 10/2011 | Ebner | H03M 1/1061 341/146 |
| 8,125,361 | B2 | 2/2012 | Choe et al. | |
| 9,337,854 | B1 | 5/2016 | Chen | |
| 9,577,657 | B1 * | 2/2017 | Clara | H03M 3/38 |
| 10,579,086 | B2 | 3/2020 | Zhu et al. | |
| 10,581,442 | B2 * | 3/2020 | Kauffman | H03M 1/1004 |
| 10,727,853 | B1 * | 7/2020 | Zhao | H03M 1/124 |

(Continued)

OTHER PUBLICATIONS

Bugeja, A. R., et al., "A self-trimming 14-b 100-MS/s CMOS DAC", IEEE Journal of Solid-State Circuits vol. 35, Iss. 12, (2000), 1841-1852.

(Continued)

*Primary Examiner* — Lam T Mai
(74) *Attorney, Agent, or Firm* — Schwegman Lundberg & Woessner, P.A.

(57) ABSTRACT

A digital-to-analog converter (DAC) calibration system for calibrating N DAC cells in a DAC, where N can be an integer number of DAC cells greater than 2, can include a processor, which can be configured to configure the DAC to generate N reference outputs, configure the DAC to generate N calibration outputs, and determine N overall error values corresponding to a difference between respective individual ones of the N calibration outputs and the N reference outputs. The processor can also be configured to determine, such as using the N overall error values, a cell error value for each of the N DAC cells.

20 Claims, 11 Drawing Sheets

(56) References Cited

U.S. PATENT DOCUMENTS

| | | | | |
|---|---|---|---|---|
| 10,855,301 | B2 | 12/2020 | Zhou | |
| 10,965,302 | B1 * | 3/2021 | Zhao | H03M 7/165 |
| 11,075,643 | B2 | 7/2021 | Zhao et al. | |
| 11,128,310 | B1 * | 9/2021 | Zhao | H03M 1/1071 |
| 12,401,371 | B2 * | 8/2025 | Engel | H03M 1/1009 |
| 2012/0050080 | A1 * | 3/2012 | Mclachlan | H03M 1/0612 341/118 |
| 2018/0183452 | A1 | 6/2018 | Bresciani et al. | |
| 2021/0194492 | A1 * | 6/2021 | Zhao | H03M 1/109 |
| 2022/0200617 | A1 | 6/2022 | Clara et al. | |
| 2023/0266780 | A1 * | 8/2023 | Li | A61B 6/585 323/304 |

OTHER PUBLICATIONS

Clara, M., et al., "A 1.5V 200MS/s 13b 25mW DAC with Randomized Nested Background Calibration in 0.13/spl mu/m CMOS", 2007 IEEE International Solid-State Circuits Conference, Digest of Technical Papers, (Feb. 2007), 3 pgs.

Kim, J., et al., "A Redundancy-Based Calibration Technique for High-Speed Digital-to-Analog Converters", IEEE Transactions on Very Large Scale Integration (VLSI) Systems, vol. 29, Iss. 3, (Nov. 2015), 2395-2407.

Li, You, et al., "A High Resolution and High Accuracy R-2R DAC Based on Ordered Element Matching", 2013 IEEE International Symposium on Circuits and Systems (ISCAS), (2013), 1974-1977.

Liu, R., et al., "Extended statistical element selection: A calibration method for high resolution in analog/RF designs", 2016 53rd ACM/EDAC/IEEE Design Automation Conference (DAC), (Jun. 2016), 6 pgs.

Tang, Y., et al., "A 14 bit 200 MS/s DAC With SFDR >78 dBc, IM3 < −83 dBc and NSD <−163 dBm/Hz Across the Whole Nyquist Band Enabled by Dynamic-Mismatch Mapping", IEEE Journal of Solid-State Circuits vol. 46, Iss. 6, (2011), 1371-1381.

Tseng, Wei-Hsin, et al., "A 12-Bit 1.25-GS/s DAC in 90 nm CMOS With >70 dB SFDR up to 500 MHz", IEEE Journal of Solid-State Circuits vol. 46, Iss. 12, (2011), 2845-2856.

"European Application Serial No. 25174609.5, Extended European Search Report mailed Aug. 10, 2025", 14 pgs.

Clara, Martin, "A 1,5V 200MS S 13b 25mW DAC with Randomized Nested Background Calibration in 0.13 m CMOS", (Feb. 11, 2007), 250-252.

Georgi, Ivanov Radulov, "Flexible and Self-Calibrating Current-Steering Digital-to-Analog Converters: Analysis, Classification and Design", Eindoven University of Technology Library, (Jan. 14, 2010,), 290 pgs.

Martin, Clara, "A 1,5V 13bit 130-300MS S self-calibrated DAC with active output stage and 50MHz signal bandwidth in 0.13[mu]m CMOS", Proceedings of the ESSCIRC (ESSCIRC), (Sep. 1, 2008), 262-265.

"European Application Serial No. 25174609.5, Response filed Mar. 10, 26 to Extended European Search Report mailed Oct. 8, 2025", 17 pgs.

* cited by examiner

310

| Name | Current Ratio |
| --- | --- |
| $I_{MSBREF}$ | x16 |
| $I_{LSB,1-2}$ | x8 |
| $I_{LSB,3-4}$ | x4 |
| $I_{LSB,5-6}$ | x2 |
| $I_{LSB,7-8}$ | x1 |
| $I_{LSB,9}$ | x1 |
| $I_{LSB,10}$ | x1 |
| $I_{LSB,11}$ | x1 |
| $I_{LSB,12}$ | x1 |
| $I_{LSB,13}$ | x1 |
| $I_{LSB,14}$ | x1 |

| Vector # | LSB1 | LSB2 | LSB3 | LSB4 | LSB5 | LSB6 | LSB7 | LSB8 | LSB9 | LSB10 | LSB11 | LSB12 | LSB13 | LSB14 |
|---|---|---|---|---|---|---|---|---|---|---|---|---|---|---|
| #1 | 0 | 1 | 1 | 0 | 1 | 0 | 0 | 0 | 0 | 1 | 0 | 0 | 1 | 0 |
| #2 | 1 | 0 | 1 | 0 | 0 | 1 | 1 | 0 | 1 | 0 | 0 | 0 | 0 | 0 |
| #3 | 0 | 0 | 1 | 1 | 1 | 0 | 1 | 1 | 1 | 1 | 1 | 0 | 0 | 1 |
| #4 | 0 | 1 | 0 | 1 | 0 | 1 | 0 | 1 | 0 | 0 | 0 | 0 | 0 | 1 |
| #5 | 1 | 0 | 1 | 1 | 0 | 0 | 0 | 0 | 0 | 0 | 0 | 0 | 0 | 0 |
| #6 | 0 | 0 | 1 | 1 | 1 | 1 | 1 | 0 | 1 | 0 | 1 | 0 | 0 | 1 |
| #7 | 1 | 0 | 0 | 0 | 1 | 1 | 0 | 0 | 1 | 1 | 1 | 0 | 1 | 0 |
| #8 | 1 | 0 | 0 | 1 | 0 | 0 | 0 | 1 | 0 | 0 | 1 | 0 | 1 | 1 |
| #9 | 1 | 0 | 0 | 0 | 0 | 1 | 1 | 1 | 1 | 1 | 0 | 0 | 1 | 1 |
| #10 | 0 | 0 | 1 | 1 | 1 | 1 | 0 | 1 | 0 | 0 | 1 | 1 | 1 | 0 |
| #11 | 0 | 1 | 0 | 1 | 0 | 0 | 1 | 1 | 0 | 0 | 1 | 0 | 1 | 0 |
| #12 | 0 | 1 | 0 | 1 | 1 | 0 | 0 | 0 | 0 | 0 | 0 | 1 | 1 | 0 |
| #13 | 1 | 0 | 0 | 0 | 0 | 1 | 1 | 1 | 0 | 1 | 0 | 1 | 1 | 1 |
| #14 | 0 | 1 | 0 | 0 | 0 | 1 | 1 | 0 | 1 | 1 | 1 | 1 | 1 | 0 |

| | LSB1 | LSB2 | LSB3 | LSB4 | LSB5 | LSB6 | LSB7 | LSB8 | LSB9 | LSB10 | LSB11 | LSB12 | LSB13 | LSB14 |
|---|---|---|---|---|---|---|---|---|---|---|---|---|---|---|
| Unit Current | 8 | 8 | 4 | 4 | 2 | 2 | 1 | 1 | 1 | 1 | 1 | 1 | 1 | 1 |
| Unit Mismatch Current | $\Delta I_{lsb1}$ | $\Delta I_{lsb2}$ | $\Delta I_{lsb3}$ | $\Delta I_{lsb4}$ | $\Delta I_{lsb5}$ | $\Delta I_{lsb6}$ | $\Delta I_{lsb7}$ | $\Delta I_{lsb8}$ | $\Delta I_{lsb9}$ | $\Delta I_{lsb10}$ | $\Delta I_{lsb11}$ | $\Delta I_{lsb12}$ | $\Delta I_{lsb13}$ | $\Delta I_{lsb14}$ |

331

| Vector #1 | 0 | 1 | 1 | 0 | 1 | 0 | 0 | 0 | 0 | 1 | 0 | 0 | 1 | 0 |
|---|---|---|---|---|---|---|---|---|---|---|---|---|---|---|

| Output Current | 0 | 8 | 4 | 0 | 2 | 0 | 0 | 0 | 0 | 1 | 0 | 0 | 1 | 0 |
|---|---|---|---|---|---|---|---|---|---|---|---|---|---|---|
| Output Mismatch Current | 0 | $\Delta I_{lsb2}$ | $\Delta I_{lsb3}$ | 0 | $\Delta I_{lsb5}$ | 0 | 0 | 0 | 0 | $\Delta I_{lsb10}$ | 0 | 0 | $\Delta I_{lsb13}$ | 0 |

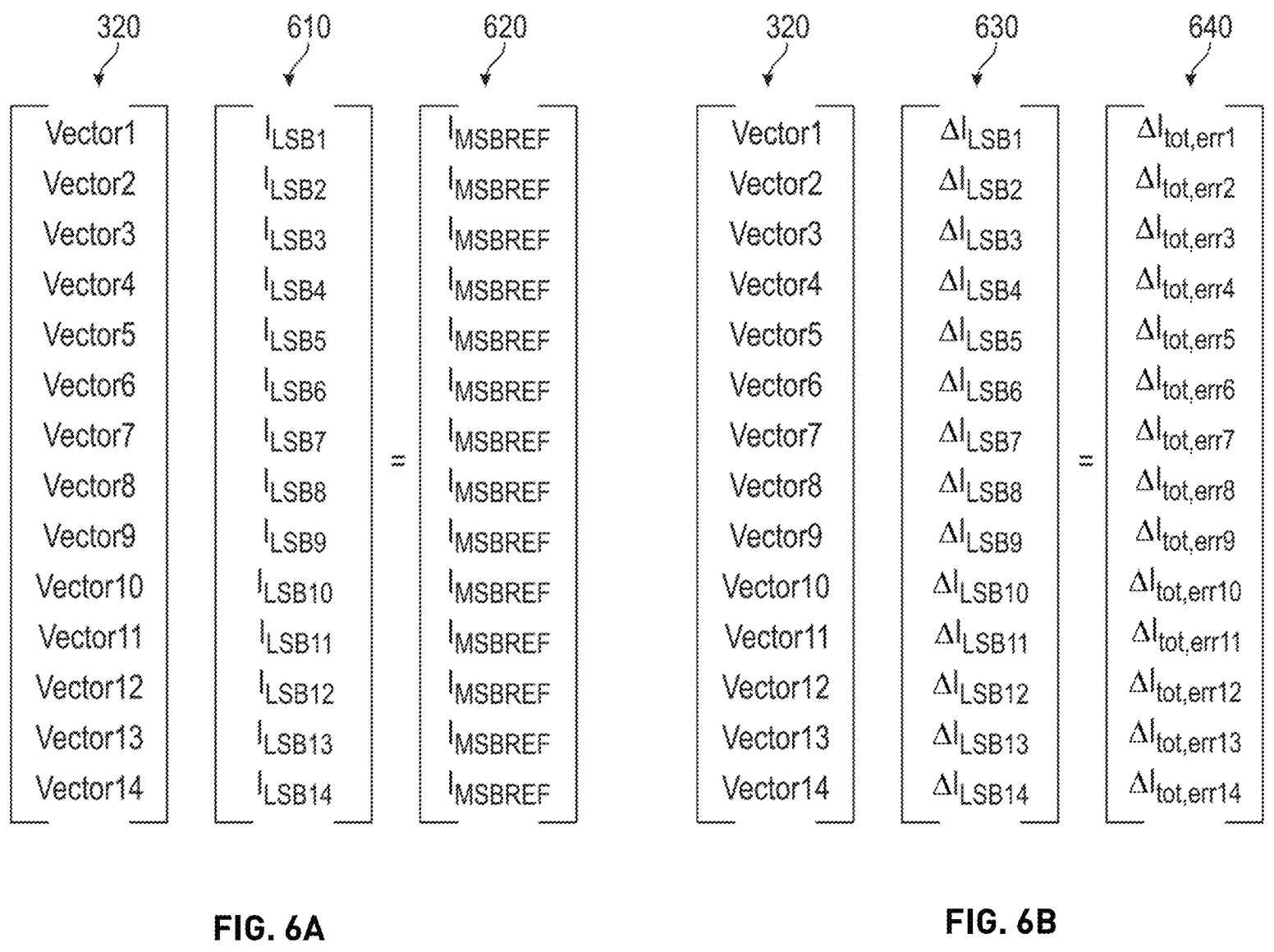

Vector1 Vector2 Vector3 Vector4 Vector5 Vector6 Vector7 Vector8 Vector9 Vector10 Vector11 Vector12 Vector13 Vector14

610

$I_{LSB1}$ $I_{LSB2}$ $I_{LSB3}$ $I_{LSB4}$ $I_{LSB5}$ $I_{LSB6}$ $I_{LSB7}$ $I_{LSB8}$ $I_{LSB9}$ $I_{LSB10}$ $I_{LSB11}$ $I_{LSB12}$ $I_{LSB13}$ $I_{LSB14}$

=

620

$I_{MSBREF}$ $I_{MSBREF}$ $I_{MSBREF}$ $I_{MSBREF}$ $I_{MSBREF}$ $I_{MSBREF}$ $I_{MSBREF}$ $I_{MSBREF}$ $I_{MSBREF}$ $I_{MSBREF}$ $I_{MSBREF}$ $I_{MSBREF}$ $I_{MSBREF}$ $I_{MSBREF}$

Vector1 Vector2 Vector3 Vector4 Vector5 Vector6 Vector7 Vector8 Vector9 Vector10 Vector11 Vector12 Vector13 Vector14

630

$\Delta I_{LSB1}$ $\Delta I_{LSB2}$ $\Delta I_{LSB3}$ $\Delta I_{LSB4}$ $\Delta I_{LSB5}$ $\Delta I_{LSB6}$ $\Delta I_{LSB7}$ $\Delta I_{LSB8}$ $\Delta I_{LSB9}$ $\Delta I_{LSB10}$ $\Delta I_{LSB11}$ $\Delta I_{LSB12}$ $\Delta I_{LSB13}$ $\Delta I_{LSB14}$

=

640

$\Delta I_{tot,err1}$ $\Delta I_{tot,err2}$ $\Delta I_{tot,err3}$ $\Delta I_{tot,err4}$ $\Delta I_{tot,err5}$ $\Delta I_{tot,err6}$ $\Delta I_{tot,err7}$ $\Delta I_{tot,err8}$ $\Delta I_{tot,err9}$ $\Delta I_{tot,err10}$ $\Delta I_{tot,err11}$ $\Delta I_{tot,err12}$ $\Delta I_{tot,err13}$ $\Delta I_{tot,err14}$

FIG. 6B

DIGITAL-TO-ANALOG CONVERTER CALIBRATION SYSTEM

TECHNICAL FIELD

The present disclosure relates to digital-to-analog converters (DACs), and more particularly, but not by way of limitation, to calibration of a DAC system.

BACKGROUND

Modern systems can use DACs to convert a digital signal into an analog signal for processing, use, or transmission. Examples of such modern systems can include communication systems, radar systems, and audio systems. In these and other modern systems, the accuracy of the DAC can be of interest.

SUMMARY

In an example, a digital-to-analog converter (DAC) calibration system for calibrating N DAC cells in a DAC, where N can be an integer number of DAC cells greater than 2, can include a processor, which can be configured to configure the DAC to generate N reference outputs, configure the DAC to generate N calibration outputs, and determine N overall error values corresponding to a difference between respective individual ones of the N calibration outputs and the N reference outputs. The processor can also be configured to determine, such as using the N overall error values, a cell error value for each of the N DAC cells.

In an example, a method of calibrating N digital-to-analog converter (DAC) cells in a DAC, where N can be an integer number of DAC cells greater than 2, can include generating N calibration outputs using the DAC, generating N reference outputs using the DAC, determining N overall error values corresponding to a difference between respective individual ones of the N calibration outputs and the N reference outputs, and determining, using the N overall error values, a cell error value for each of the N DAC cells.

In an example, a digital-to-analog converter (DAC) calibration system for calibrating N DAC cells in a DAC, where N can be an integer number of DAC cells greater than 2, can include a processor, which can be configured to configure the DAC to generate N reference outputs, configure the DAC to generate N calibration outputs, and determine N overall error values corresponding to a difference between respective individual ones of the N calibration outputs and the N reference outputs, where respective groups comprised of corresponding ones of the N reference outputs and N calibration outputs can be generated using a distinct combination of DAC cells, and where each of the N DAC cells can be used in at least one of the N reference outputs or the N calibration outputs. The processor can also be configured to determine, such as using the N overall error values, a cell error value for each of the N DAC cells.

BRIEF DESCRIPTION OF THE DRAWINGS

In the drawings, which may not be drawn to scale, like numerals may describe substantially similar components throughout one or more of the views. Like numerals having different letter suffixes may represent different instances of substantially similar components. The drawings illustrate generally, by way of example but not by way of limitation.

FIG. 3A is a table showing an example of relative weight values for DAC cells.

FIG. 3B is a table showing an example of portions of a square matrix which can include calibration output vectors.

FIG. 4 shows an example of portions of how the overall error value of a vector relates to the cell error values.

FIG. 6A is an example of portions of a matrix representation of the calibration output vectors, the cell weight values, and the reference weight values.

FIG. 6B is an example of portions of a matrix representation of the calibration output vectors, the cell error values, and the overall error values.

DETAILED DESCRIPTION

Figure 1:
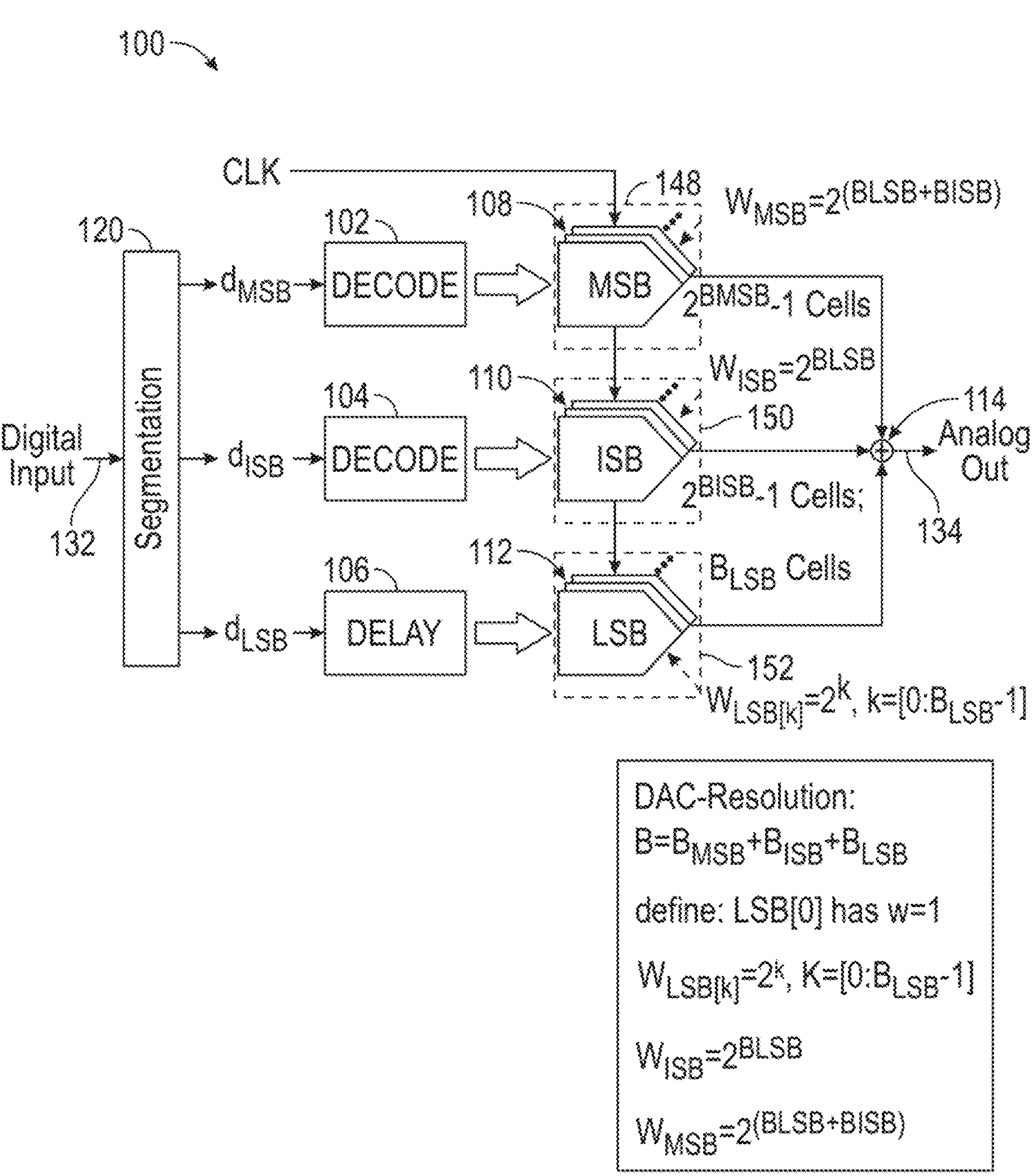
FIG. 1 is a block diagram of an example of portions of a DAC.

The present inventors have recognized, among other things, that increased accuracy of DACs can be helped by calibration or other adjustment. Calibration of a DAC can include adjusting or otherwise tailoring one or more DAC cells in the DAC, such as to one or more of increase an accuracy of the DAC, increase a precision of the DAC, increase a linearity of the DAC, or alter one or more other properties of the DAC. In an approach, a DAC cell can be compared to a reference cell, and the DAC cell can be adjusted, such as to more closely match the reference cell. However, in a DAC with DAC cells of differing weight values, this approach can benefit by having multiple reference cells, such as a reference cell corresponding to the weight value of each distinct weight. But this can one or more of increase a size, cost, or power consumption of the DAC. In an example, the reference cells can be configured to be more precise, accurate, or both than the DAC cells. But such reference cells can be one or more of more expensive, larger, or more power intensive, as compared to the DAC cells. With respect to certain circuit properties, such as linearity, it can be desirable for the respective reference cells to calibrated to each other, which can one or more of increase a processor load, increase a power consumption of the DAC, or increase a calibration time of the DAC. In an example in which the reference cells are not calibrated to each other, the DAC may not be calibrated to be linear.

The present inventors have recognized, among other things, that it can be desirable to calibrate a DAC using a limited number of reference cells. For example, this can include calibrating a DAC system with only a single reference cell, or calibrating a DAC without reference cells. This can one or more of decrease a power consumption of the DAC, decrease a processor load of the DAC, decrease a calibration time of the DAC, or improve a performance of the DAC (e.g., increased linearity, increased accuracy, increased precision). For example, one or more cells in the DAC can be combined (e.g., summed, subtracted, multiplied, divided) and compared (e.g., finding a difference or approximate difference, such as to a level of digital precision) to a combination of one or more other cells in the DAC, such as in a calibration test. The result of this comparison can provide information on how the cells included in the calibration test are related (e.g., an equation describing the relation of the cells). Additional calibration tests (e.g., using the same cells, using some of the same cells and some different cells, using all different cells) can be performed, such as can provide additional determinations of relationship between the cells. One or more of the calibration tests can be used to adjust, set, calibrate, or otherwise tailor one or more cells. The information derived from two or more calibration tests can be combined, such as using one or more mathematical relationships. This can help allow for the determination of a relative or absolute calibration of one or more cells, such as by solving a system of equations formed by the calibration tests.

In an example, a reference cell having a reference weight value can be compared to various combinations of DAC cells (e.g., summations of DAC cells) in a number of calibration tests. The difference in each of the calibration tests can be recorded. The calibration tests can be configured such that the recorded differences can be used in combination with information relating to the cells used in the respective calibration tests to determine a cell error value for one or more of the DAC cells. For example, each of the calibration tests can form an equation (e.g., a linear equation), and the combination of calibration tests can form a solvable system (e.g., a solvable linear system). Solving the linear system can provide a cell error value for one or more of the DAC cells, such as for all of the DAC cells used in one or more calibration tests.

The reference cell can be configured to have a weight equal to or greater than the largest DAC cell to be calibrated, which can help allow the reference cell to be used to calibrate all of the DAC cells. Using the reference cell to calibrate the DAC cells can help increase a linearity of the system (e.g., even if the reference cell does not have a desired reference weight value, all cells calibrated with respect to the reference cell can be linear with respect to each other), and can help avoid having to calibrate multiple reference cells to each other.

Real-world analog signals such as temperature, pressure, sound, or images can be converted to a digital representation, such as for processing in digital systems. This digital information can be converted back to an analog form to perform some real-world function. The circuits that perform this step can include DACs, and their outputs can be used to drive a variety of devices. Loudspeakers, video displays, motors, mechanical servos, radio frequency (RF) transmitters, and temperature controls are a few examples. A DAC can also be used in an analog-to-digital converter (ADC), such as to provide an adjustable analog voltage for reference or comparison in the ADC.

A DAC can be a circuit, device, or system that produces a quantized (discrete step) analog output in response to a digital input code. The digital input signal can be generated in the digital domain, (e.g., from transistor logic (TTL), emitter-coupled logic (ECL), complementary "metal"-"oxide"-semiconductor (CMOS) circuits, or low-voltage differential signaling (LVDS), digital logic, a processor, etc.) The DAC can convert the digital input signal into an analog output signal. The analog output signal of the DAC can be a voltage signal, a current signal, or combinations thereof. In some cases, the digital input signal can include binary-coded bits, or thermometer-coded bits. Bits of the digital input can be provided to drive or control circuits in the DAC to generate the analog output.

To generate the DAC output, a reference quantity can be divided into binary and/or linear fractions. One or more DAC cells can be implemented for each one of those fractions. The digital input can drive switches to individual DAC cells having appropriate weights corresponding to those fractions. Respective parts of the digital input can drive respective DAC cells to deliver an aggregate output of the DAC cells that is representative of the digital input. DAC cells can include current sources, voltage sources, resistors, capacitors, etc. The DAC cells can be actuated by the digital input, i.e., digital input code, to generate the analog output. In some embodiments, the outputs of the DAC cells are summed or combined to generate the aggregate output.

In some cases, a segmented DAC can use different circuit architectures and/or coding for different segments of the digital input. Segmented architectures, where the full resolution of the converter is spread across two or more sub-DACs, can be used for both current-output and voltage-output DACs. The sub-DACs of the overall DAC need not have the same resolution. In some cases, redundant circuits can also be provided in the DAC where additional circuitry or DAC cells are included.

FIG. 1 shows a block diagram of an example of portions of a DAC 100. As shown in FIG. 1, the DAC 100 can receive a digital input signal on a digital input bus 132 and can generate an analog output signal on the analog calibration output node 134. The DAC 100 can include a segmentation circuit 120, one or more segmented DAC portions (e.g., segment 148, segment 150, segment 152), and a summing circuit 114.

FIG. 1 shows that a DAC 100 can be a segmented DAC, such as can divide the digital input signal into two or more segments, generate a corresponding analog output signal in each of the two or more segments, and sum the corresponding analog output signals to form the overall analog output signal of the DAC. In an example, a DAC can have only a single segment, such as can omit a segmentation circuit 120 or a summing circuit 114. A segmented DAC can be desirable because it can one or more of reduce a circuit complexity (e.g., reduce a number of components), increase a circuit accuracy, reduce a circuit size, reduce a cost of circuit production, etc.

A DAC segment can be unary or binary. A binary DAC segment can include DAC cells that have a binary weight (e.g., the second cell has two times the weight of the first, the third cell has four times the weight of the first, the fourth cell has eight times the weight of the first, etc.). A binary DAC segment can generate an analog output signal from a binary-coded digital input signal by applying the binary-coded digital input signal to the corresponding DAC cells.

A unary DAC segment can include DAC cells that all have a specified common weight (e.g., the second cell has a weight equal to the first, the third cell has a weight equal to the first, the fourth cell has a weight equal to the first, etc.). A unary DAC segment can generate an analog output signal from a binary-coded digital input signal by generating a thermometer-coded digital input signal corresponding to the binary-coded digital input signal and applying the thermometer-coded digital input signal to corresponding DAC cells. A DAC can include one or more binary DAC segments and/or one or more unary DAC segments. In a unary DAC segment, because all cells share a common weight, one or more cells can be shuffled with one or more other cells, which can help improve one or more features of the DAC.

FIG. 1 shows a DAC 100 with two unary DAC segments (segment 148 and segment 150) and one binary DAC segment (segment 152). FIG. 1 shows that the digital input signal can be provided to a segmentation circuit 120 that can separate the digital input signal into its most significant bits dMSB, intermediate significant bits dISB, and least significant bits dLSB. The digital input signal can be binary coded, as shown in FIG. 1, thermometer coded, or combinations thereof.

Most significant bits dMSB can be provided to decoder block 102. Intermediate significant bits dISB can be provided to decoder block 104. Decoder block 102 and decoder block 104 can decode the most significant bits dMSB and the intermediate significant bits dISB from binary coding to thermometer coding, so that unary DAC cells (e.g., DAC cells having the same bit weight) for the MSB segment and the ISB segments can convert the most significant bits dMSB and the intermediate significant bits dISB into respective analog outputs of the MSB and ISB segments. Least significant bits dLSB can be provided to delay block 106 (to provide and/or mimic delay of the decoder blocks 102 and 104). Binary weighted DAC cells can convert the least significant bits dLSB into an analog output of the LSB segment. The full resolution of the DAC 100 can be B=BMSB+BISB+BLSB. BMSB can be the number of bits for the most significant bit segment, BISB can be the number of bits for the intermediate significant bits, and BLSB can be the number of bits for the least significant bits. Unary DAC cells 108 for the most significant bits segment can include at least $2^{BMSB}-1$ DAC cells, which all have the same bit weight $wMSB=2^{BLSB+BISB}$. Unary DAC cells 110 for the intermediate significant bits segment can include at least $2^{BISB}=1$ DAC cells, which all have the same bit weight $wISB=2^{BLSB}$. Binary DAC cells 112 can include at least BLSB DAC cells, which can have different binary bit weights $wLSB[k]=2^{k}$, k=[0:BLSB−1]. The different segments can generate a respective analog output based on the respective digital input to the different segments. A summing circuit 114 can sum respective outputs of the segment 148, the segment 150, and the segment 152, such as to generate an analog output of the DAC 100.

In some cases, the decoder blocks 102 and 104 (either one or both) can include shuffling circuitry to shuffle one or more of the DAC cells. In some cases, decoder blocks 102 and 104 (either one or both) can be binary-to-shuffled thermometer code circuits, such as can implement additional logic to shuffle the Unary DAC cells 108 and 110, such as to average out or otherwise help reduce the effect of mismatches between cells, reduce an aging effect on cells, spread out an aging effect between cells, reduce distortion at the analog output, etc.

Figure 2:
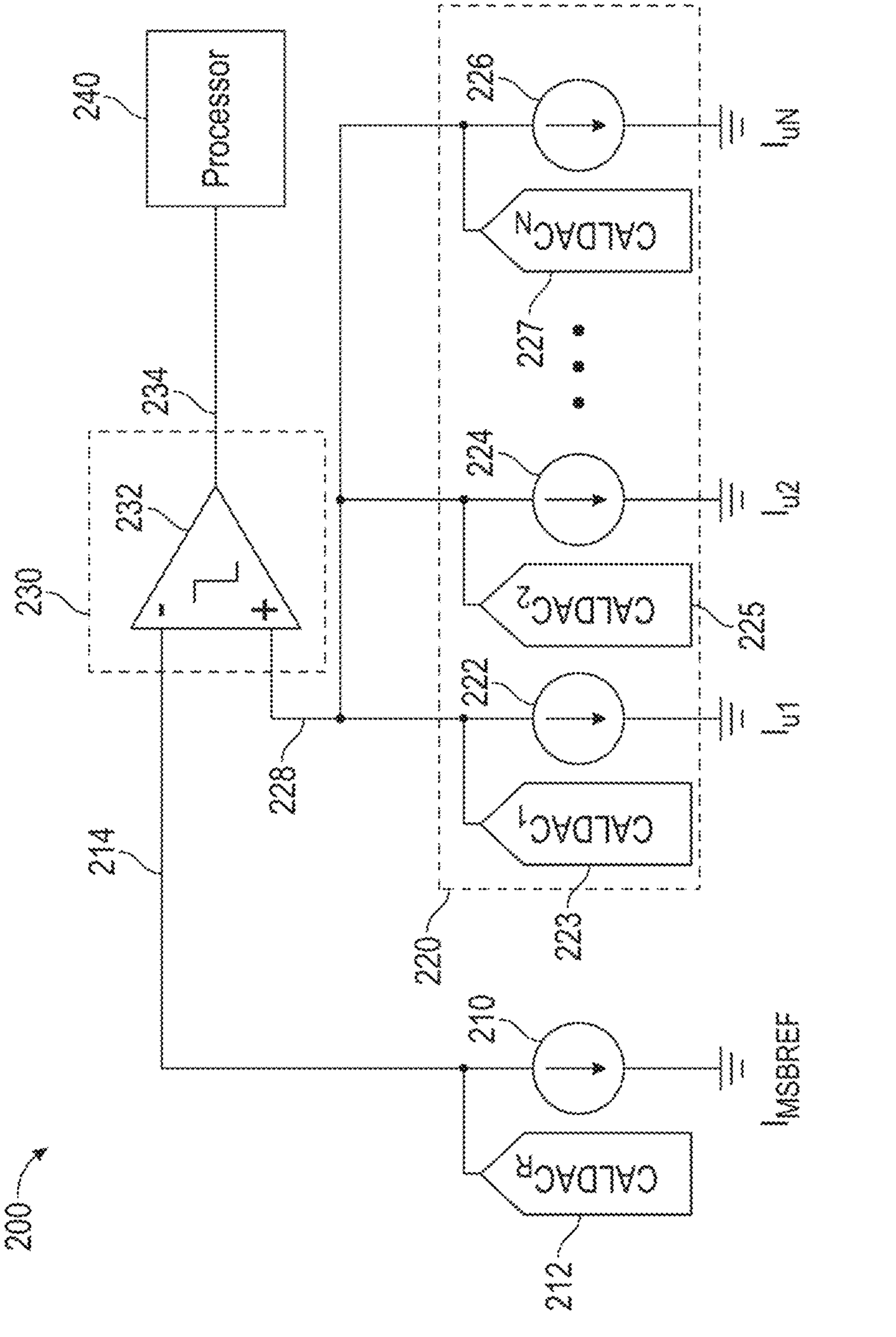
FIG. 2 is a block diagram of an example of portions of a DAC calibration system.

FIG. 2 is a block diagram of an example of portions of a DAC calibration system 200. FIG. 2 shows that the DAC calibration system 200 can include a reference cell 210, one or more DAC cells 220, measurement circuitry 230, and a processor 240. The DAC calibration system 200 can be configured for calibrating one or more DAC cells (e.g., N DAC cells, where N is an integer number of DAC cells greater than or equal to 2) in a DAC. Calibrating a DAC cell can include adjusting or otherwise tailoring a weight value of the DAC cell, such as to one or more of match the weight value of the DAC cell to a specified weight value, match the weight value of the DAC cell to one or more other DAC cells, or match the weight value of the DAC cell to a specified multiple (e.g., 2 times the weight of another DAC cell, one-half the weight of another DAC cell) of the weight value of one or more other DAC cells. In an example, the DAC calibration system 200 can include or be included in a DAC, such as DAC as discussed with respect to FIG. 1.

The reference cell 210 can be configured to provide a specified reference weight value. The reference weight value can be a specified, measured, or calibrated value. The reference cell 210 can be any type of cell (e.g., current cell, voltage cell), such as can include one or more of the cells discussed above with respect to FIG. 1. The reference cell 210 can include a reference cell calibration DAC 212. In an example, the reference cell 210 does not include the reference cell calibration DAC 212, but can be used in conjunction with the reference cell calibration DAC 212.

The reference cell calibration DAC 212 can be configured to adjust or otherwise alter a weight value of the reference cell 210. For example, the reference cell calibration DAC 212 can be configured to add, subtract, or both from the weight value of the reference cell 210. The reference cell calibration DAC 212 can be adjustable. For example, the reference cell calibration DAC 212 can be configurable to provide a range of adjustments, such as can include a range in discrete steps. The reference cell calibration DAC 212 can be a DAC that receives a digital input and generates an analog output that adjusts the weight value of the reference cell 210. The adjustment of the reference cell 210 by the reference cell calibration DAC 212 can cover a specified percentage of the base weight value of the reference cell 210, such as can include one percent of the base weight value, two percent of the base weight value, five percent of the base weight value, 10 percent of the base weight value, or 15 percent of the base weight value. In an example, the reference cell 210 is configured to provide a configurable weight value without the use of a reference cell calibration DAC 212. In this example, the reference cell calibration DAC 212 can be omitted and the configurable properties of the reference cell 210 can be used in place of or in conjunction with the reference cell calibration DAC 212. The reference cell 210 can produce a reference output 214, such as can include a weight value of the reference cell 210 summed with an output of the reference cell calibration DAC 212.

The DAC cells 220 can form a portion of a DAC. For example, the DAC cells 220 can be used in a DAC to generate a specified analog output value corresponding to a digital input value. The DAC can be of any configuration, such as discussed above with respect to FIG. 1. The DAC cells 220 can include a first DAC cell 222, a second DAC cell 224, and a Nth DAC cell 226, where N is any integer number greater than or equal to 2. In an example, N can be any integer number greater than 2. The DAC cells 220 can include any number of DAC cells. The DAC cells 220 can be included in one or more DAC segments, which can include unary DAC segments, binary DAC segments, or both. In an example, one or more of the DAC cells 220 can be configured similarly to the reference cell calibration DAC 212. The DAC cells 220 can produce a calibration output 228, which can represent a summation of the weight values of one or more of the DAC cells in the DAC cells 220 (e.g., selected DAC cells are summed).

One or more of the first DAC cell 222, the second DAC cell 224, or the Nth DAC cell 226 can be configured to provide a specified weight value, which can include a specified, measured, or calibrated value. The weights of the DAC cells 220 can match, differ, or both. The DAC cells 220 can include one or more calibration DACs, which can include a first DAC cell calibration DAC 223, a second DAC cell calibration DAC 225, and a Nth DAC cell calibration DAC 227. The first DAC cell 222 can include or be used in conjunction with the first DAC cell calibration DAC 223. The second DAC cell 224 can include or be used in conjunction with the second DAC cell calibration DAC 225. The Nth DAC cell 226 can include or be used in conjunction with a Nth DAC cell calibration DAC 227. One or more of the calibration DACs in the DAC cells 220 can be configured similarly to the reference cell calibration DAC 212, or one or more can differ in one or more ways. For example, the first DAC cell calibration DAC 223 can be configured to adjust a weight value of the first DAC cell 222 (e.g., following a calibration). The second DAC cell calibration DAC 225 can be configured to adjust a weight value of the second DAC cell 224. The Nth DAC cell calibration DAC 227 can be configured to adjust a weight value of the Nth DAC cell 226.

The measurement circuitry 230 can be configured to receive the reference output 214 and the calibration output 228. The measurement circuitry 230 can be configured to make a determination about the reference output 214 and the calibration output 228, which can include one or more of determining the difference between the reference output 214 and 228, determining which of the reference output 214 and the calibration output 228 is larger, or another determination. The measurement circuitry 230 can include a comparator 232. The comparator 232 can be configured to compare the reference output 214 to the calibration output 228 and determine which of the reference output 214 or the calibration output 228 is larger. The result of the comparison can be provided on the comparator output 234. In an example, the measurement circuitry 230 can include a quantizer, which can be configured to measure a difference between the reference output 214 and the calibration output 228.

The processor 240 can be any general-purpose or dedicated processor or computing circuit, such as discussed below with respect to FIG. 10. The processor 240 can be configured to control one or more portions of the DAC calibration system 200, such as can include controlling one or more of the reference cell 210, the reference cell calibration DAC 212, the DAC cells 220 (e.g., one or more of the DAC cells in the DAC cells 220, one or more of the calibration DACs in the DAC cells 220). The processor 240 can be configured to receive one or more outputs from the measurement circuitry 230, which can include the comparator output 234. The processor 240 can be configured to one or more of adjust the DAC calibration system 200, take one or more measurements, perform calculations, or calibrate the DAC cells 220.

The processor 240 can be configured to configure the DAC to generate one or more reference outputs, which can include N reference outputs. The reference outputs can be provided on the reference output 214. The reference output 214 can be an internal point within the DAC calibration system 200 (e.g., a point within the DAC calibration system 200 that is not pinned to be accessible outside of the DAC calibration system 200). In an example, the reference cell can generate one or more of the reference outputs, which can include the reference cell generating the N reference outputs.

The processor 240 can be configured to configure the DAC to generate one or more calibration outputs, which can include N calibration outputs. The calibration outputs can include selected ones of the DAC cells 220 providing their output to be summed on the calibration output 228. The calibration output 228 can be an internal point within the DAC calibration system 200 (e.g., a point between the DAC cells 220 and an output pin of the DAC calibration system 200), or can be an output pin of the DAC. The calibration outputs can have a specified weight, such as can include a sum of the individual weight values of the DAC cells 220 that are used in the calibration outputs.

The processor 240 can be configured to determine respective error values between the one or more reference outputs and the one or more calibration outputs. In an example, this can include determining N overall error values corresponding to a difference between respective individual ones of the N calibration outputs and the N reference outputs. In an example where the reference outputs are generated by the reference cell 210, the N overall error values can correspond to a difference between respective individual ones of the reference weight value and the specified N calibration outputs (e.g., the reference weight value minus a respective calibration output).

The processor 240 can be configured to determine one or more cell error values using the result of the comparisons. In an example, this can include determining, using the N overall error values, a cell error value for each of the N DAC cells. The cell error value of an individual cell an correspond to a difference between the weight of the cell and a desired, specified, or calibrated weight. Adjusting the weight value of the cell based on the cell error value (e.g., towards the desired, specified, or calibrated weight), can alter one or more properties of the DAC, which can include the accuracy, precision, or linearity (e.g., how closely the steps in digital output match across one or more ranges of DAC outputs). Determining one or more cell error values can include solving a system of equations. The system of equations can be formed using information about the reference outputs, the calibration outputs, and the respective comparisons. For example, an equation can formed by equating the reference weight value provided on the reference output 214 plus the overall error value to the calibration output weight value provided on the calibration output 228. The system of equations can be solved using any method, such as can include the matrix method (e.g., as discussed below), Cramer's rule, iterative methods, or another method (e.g., a method that can be implemented on a computer to solve systems of equations).

In an example, one or more of the reference outputs may not be generated by the reference cell 210 alone, or may not be generated using the reference cell 210. In this example, the reference cell 210 may be omitted. The reference outputs can be generated by selected ones of the DAC cells 220 providing their output to be summed on the reference output 214. The reference outputs can have a specified weight, such as can include a sum of the individual weight values of the DAC cells 220 that are used in the reference outputs. For example, one or more of the DAC cells 220 can be selected to be used in the reference output, and one or more of the DAC cells 220 can be selected to be used in the calibration output. In an example, a DAC cell can only be used in one of the reference output or the calibration output at one time. In this example, an equation can be formed by equating the weight value provided on the reference output 214 by a combination of DAC cells 220 plus the overall error value to the calibration output weight value provided on the calibration output 228.

In an example, each of the N calibration outputs are generated using a distinct combination of DAC cells 220. This can result in N distinct (e.g., independent) equations, which can help to provide a solvable system of equations. For example, if one of the calibration outputs matched another calibration output and both are equated to the reference weight value, both equations would provide the same information about the cell error values, and the second calibration test would not provide additional information. In an example, each of the N DAC cells 220 are used in at least one of the N calibration outputs. This can help to provide the system of equations with at least one piece of information about each of the DAC cells 220. For example, if a DAC cell was not used in at least one of the calibration outputs, the system of equations would not include any information about the DAC cell, which can prevent the solution of the system from providing information about the cell error value of the DAC cell.

In an example where the reference output is generated by a combination of the DAC cells 220, respective groups comprised of corresponding ones of the N reference outputs and N calibration outputs (e.g., the group of cells used in the first reference output as well as the group of cells used in the first calibration output) can be generated using a distinct combination of DAC cells. In an example, each of the N DAC cells are used in at least one of the N reference outputs or the N calibration outputs.

In an example, each of the N calibration outputs of the DAC are configured to have a same weight value. For example, each of the DAC cells 220 can be configured to have a nominal weight value. For example, in a unary DAC segment, the nominal weight values of all of the DAC cells would be the same. However, the actual weight values may not match. By determining a difference between the actual weight value and the nominal weight value, the DAC cells can be calibrated towards the nominal weight value. In a binary DAC segment, one or more of the DAC cells can be configured to have a weight value that is a multiple of another DAC cell. For example, if the least significant bit has a weight value of one, there can be additional bits with a weight value of one alternatively or in addition to one or more bits with a weight value of two, four, eight, etc. Reference outputs and calibration outputs can be selected such that the nominal weight values of the calibration output matches the nominal weight values of reference outputs. However, due to the actual weight values of one or more of the DAC cells 220 not matching their nominal value, an overall error value can be determined.

In an example the weight value of each of the N calibration outputs are configured to match the reference weight value of the reference cell 210. For example, the reference weight value can have a specified nominal value, and the calibration outputs can be selected to have a matching nominal weight value. In an example, the reference cell 210 can have a reference weight value that is equal to the nominal value of the largest of the DAC cells 220.

In an example, the overall error value of a calibration output can correspond to a sum of the cell error values for the DAC cells that are used to generate the calibration output. For example, each of the cell error values can be equal to a difference between their nominal weight value and their actual weight value. A weight value of the reference cell 210 can be specified as equal to its nominal weight value (e.g., the reference cell 210 is assigned as "accurate," and the DAC cells 220 are calibrated to the reference cell 210). In this example, a deviation in the weight value of the reference cell 210 from the desired weight value of the reference cell 210 can cause the DAC cells 220 to be calibrated to an other than desired weight value as well. However, because all of the cells are calibrated to the reference cell 210, the DAC can still be calibrated to generate a linear output (e.g., all of the steps are calibrated to match, even though each step may have an other than desired weight).

In an example, each of the N overall error values and the cell error values making up the corresponding ones of the N overall error values can form a linear equation. For example, the nominal weights of the reference cell 210 and the DAC cells 220 used in the calibration output can be removed (e.g., because they are defined as being equal), and the equation can equate the overall error value to the sum of the individual cell error values. For example, the overall error value can be equated to a linear equation representation of the individual cell error values. Each of the coefficients can be one (e.g., each DAC cell provides one times its weight value). In an example, determining the cell error value for each of the N DAC cells can include solving a system of N linear equations.

In an example, the DAC calibration system 200 can include adjustment circuitry, which can be configured to adjust at least one of the reference weight value or a weight value of a DAC cell. The adjustment circuitry can include one or more of the reference cell calibration DAC 212 or one or more of the calibration DACs in the DAC cells 220. The processor 240 can be configured to determine the N overall error values by adjusting the adjustment circuitry until an adjustment value at which a state of the comparator changes is found. For example, if the adjustment circuitry includes the reference cell calibration DAC 212, the reference cell calibration DAC 212 can be adjusted until the comparator 232 changes state (e.g., switching from indicating that the value on the reference output 214 is higher than the value on the calibration output 228 to indicating that the value on the calibration output 228 is higher than the value on the reference output 214). The output value of the reference cell calibration DAC 212 (e.g., the output of the reference cell calibration DAC 212 based on a specified input can be specified, measured, or calibrated) can be used as the cell error value.

In an example, the processor 240 adjusts the adjustment circuitry using a binary search algorithm, such as to reduce or otherwise tailor a number of settings of the adjustment circuitry that must be tested to determine the adjustment value at which the state of the comparator changes. For example, the processor 240 can set the reference cell calibration DAC 212 to a base value (e.g., no addition or subtraction from the reference cell 210). Based on a result of the comparison, the processor 240 can set the reference cell calibration DAC 212 to subtract half of largest configurable value (e.g., if the comparison indicates the calibration output 228 is less than the 214) or add half of the largest configurable value (e.g., if the comparison indicates the calibration output 228 is greater than the reference output 214). The processor 240 can continue by splitting the available adjustment range of the reference cell calibration DAC 212 until the point at which the comparator 232 changes state is found (e.g., the comparator outputs a logical high value with the reference cell calibration DAC 212 at one level and a logical low value with the reference cell calibration DAC 212 adjusted by one step value).

In an example, the processor 240 can be configured to determine a second cell error value for one or more of the DAC cells 220 (e.g., each of the N DAC cells). This can include using a second set of N calibration outputs. The second set of N calibration outputs can be generated using a second set of combinations of DAC cells that can be distinct from the first set of combinations of DAC cells used for generating the first of the N calibration outputs. The processor 240 can determine an updated cell error value for each of the N DAC cells using the cell error value and the second cell error value. For example, determining an updated cell error value can include determining a central tendency (e.g., a mean, a median, a mode) of the second cell error value and the cell error value. In an example, more than two cell error values can be determined. Determining two or more cell error values and using a central tendency of these values can help to reduce an effect that a quantization error has on the calibration, reduce an effect that noise has on the calibration, or both.

The processor 240 can be configured to adjust one or more (e.g., each) of the N DAC cells based on the determined respective cell error values. For example, the processor 240 can adjust the calibration DACs or respective ones of the DAC cells 220 based on the corresponding cell error values, such as to reduce and/or minimize an error value of one or more of the DAC cells 220.

FIG. 3A is a table 310 showing an example of relative weight values for DAC cells. In the example of FIG. 3A, the DAC cells 220 can include 14 DAC cells. FIG. 3A shows that least significant bits (LSB) 7 through 14 can have a nominal weight value of 1, LSBs 5-6 can have a nominal weight value of 2, LSBs 3-4 can have a nominal weight value of 4, and LSBs 1-2 can have a nominal weight value of 8. The reference cell 210 can have a nominal weight value of 16. This reference cell 210 weight value can match a weight value of the bits in a unary DAC segment (e.g., the most significant bits (MSBs). This can allow the reference cell 210 to be used to calibrate the MSBs using a direct comparison between the reference cell 210 and the most significant bits. In an example, the MSBs could be included in the system of equations.

FIG. 3B is a table showing an example of a square matrix 320 including calibration output vectors. FIG. 3B shows that the DAC cells comprising the N calibration outputs can form N row vectors (e.g., a first calibration output vector 331 through a fourteenth calibration output vector 344 in the example of FIG. 3B). The N row vectors can form a square matrix (e.g., the number of vectors matches the length of each vector). FIG. 3B shows that each of the vectors can be formed using a distinct combination of DAC cells, and each of the DAC cells can be used in at least one error vector. FIG. 3B shows that the nominal weight value of each of the vectors can match the nominal weight value of the reference cell 210.

FIG. 4 shows an example of portions of how the overall error value of a vector relates to the cell error values using the first calibration output vector 331 as an example. The DAC cells that are represented as a 0 in the vector may not be included in the calibration output. DAC cells that are represented as a 1 in the vector may be included in the calibration output. In the first calibration output vector 331, cells 2, 3, 5, 10, and 13 are included, providing a nominal weight value of 16 (8+4+2+1+1). FIG. 4 shows that along with the nominal weight value, the cell error values of the included DAC cells can be included in the calibration output.

Figure 5:
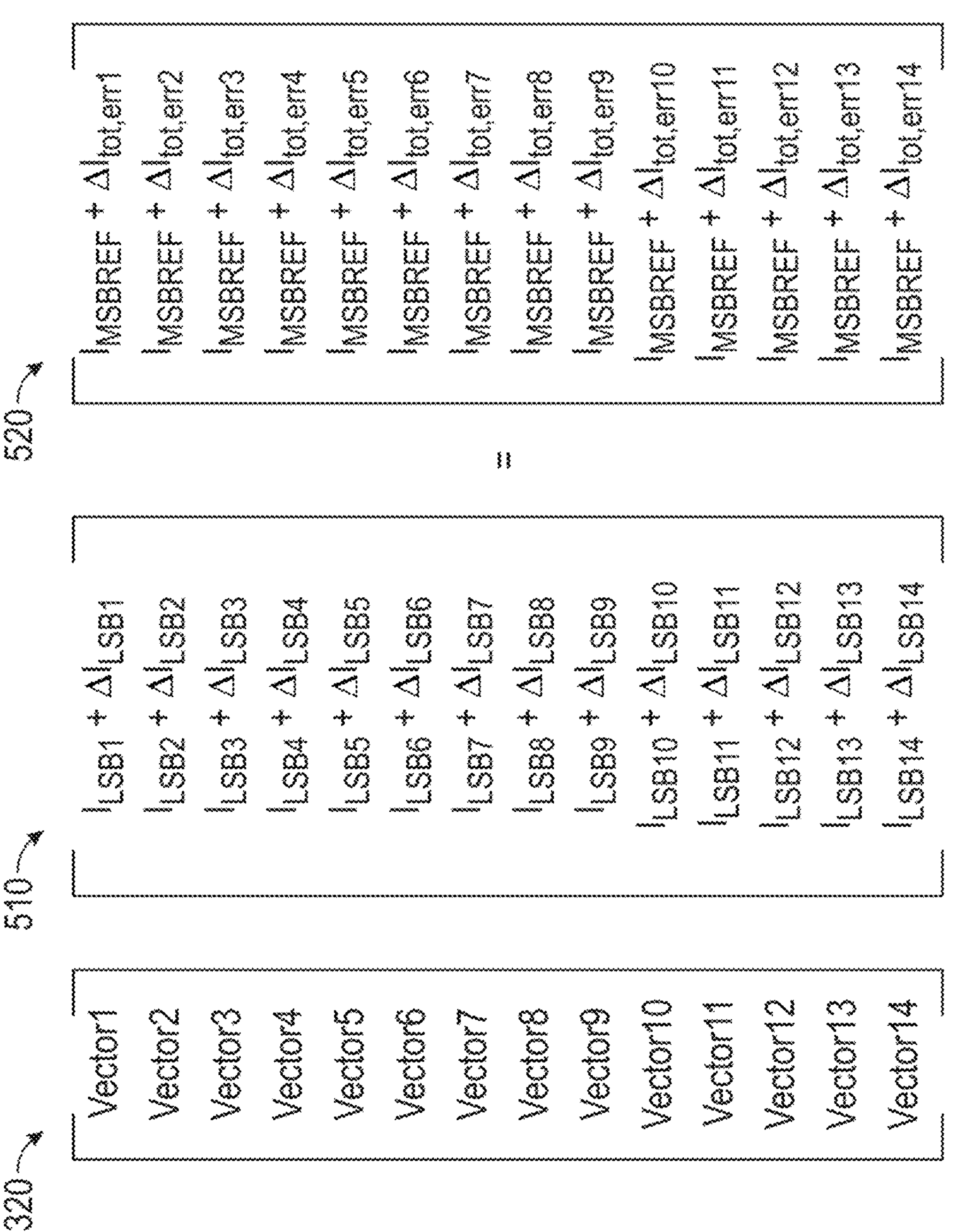
FIG. 5 is an example of portions of a matrix representation of the calibration output vectors, the cell weight values and cell error values, and the reference weight values and overall error values.

FIG. 5 is an example of portions of a matrix representation of the calibration output vectors, the cell weight values and cell error values, and the reference weight value and cell error values. FIG. 5 shows that the square matrix 320 (e.g., as shown in FIG. 3B), represented as a column vector of the calibration vectors, multiplied by a column vector 510 including the weight values of each of the DAC cells 220 (e.g., including the nominal weight value and the cell error value) equals a column vector 520 including the reference weight value plus the overall error value.

FIG. 6A is an example of portions of a matrix representation of the calibration output vectors, the cell weight values, and the reference weight values. FIG. 6A shows that the square matrix 320 multiplied by a column vector 610 including the nominal weight values of the DAC cells 220 is equal to a column vector 620 composed of a vector of the reference weight value. This can be true because the calibration output vectors are selected so that the nominal weight of the calibration outputs matches the reference output. Subtracting the column vector 610 from the column vector 510 and the column vector 620 from the column vector 520 produces the cell error column vector 630 and the overall error column vector 640 respectively, discussed with respect to FIG. 6B below.

FIG. 6B is an example of portions of a matrix representation of the calibration output vectors, the cell error values, and the overall error values. FIG. 6B shows that the N overall error values can form an overall error column vector 640. FIG. 6B shows that the square matrix 320 multiplied by the cell error column vector 630 including the respective cell error values is equal to the overall error column vector 640 including the respective overall error values. FIG. 6B shows that a nominal weight of the DAC cells 220 and the reference cell 210 can be ignored, such as can help to simplify the operations required to solve the system of equations.

Figure 7:
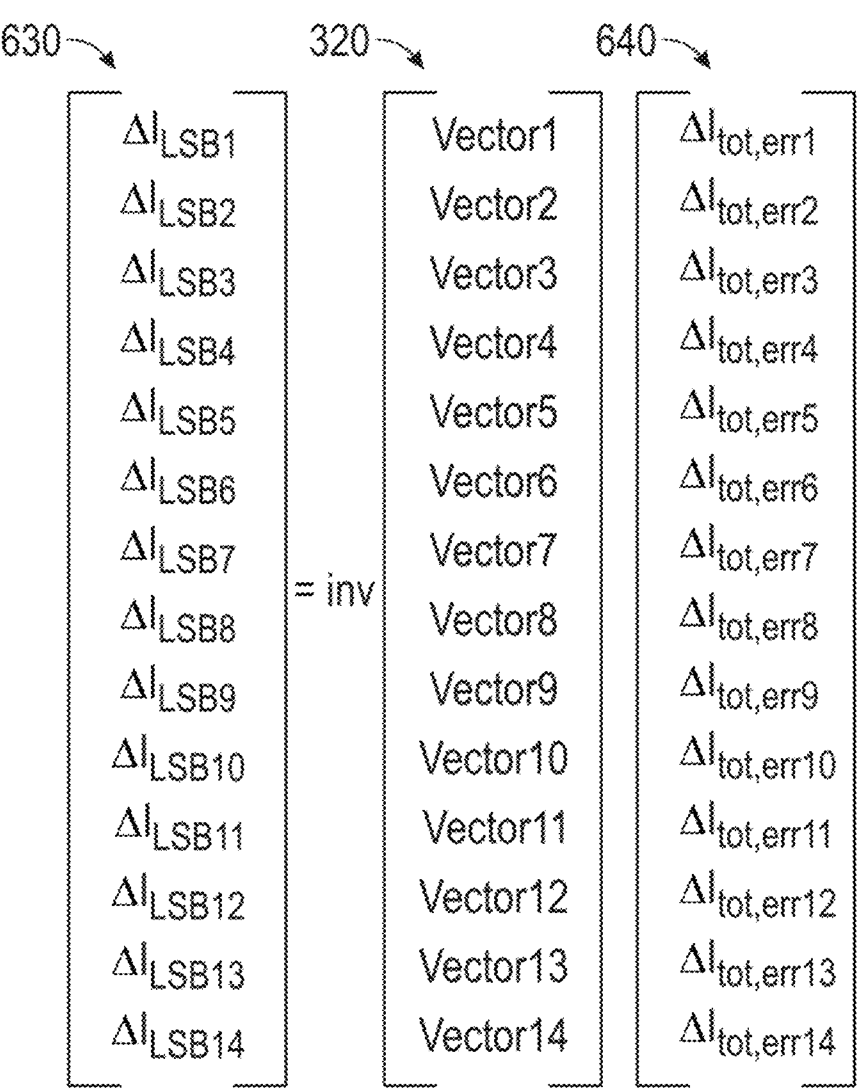
FIG. 7 is an example of portions of a cell error column vector, an inverse of a matrix representation of the calibration output vectors, and the overall error column vector.

FIG. 7 is an example of portions of a cell error column vector 630, an inverse of a matrix representation of the calibration output vectors, and the overall error column vector 640. FIG. 7 shows that multiplying the inverse of the square matrix 320 by the overall error column vector 640 can produce the cell error column vector 630 (e.g., the solution vector). The cell error column vector 630 can include the cell error values for each of the N DAC cells. The values in the square matrix 320 can be selected so that the square matrix 320 is invertible (e.g., the calibration output vectors can be selected to produce a solvable system of equations).

In an example where one or more of the reference outputs are generated using a combination of the DAC cells 220, an equation can be generated by one or more of: (1) equating the reference output plus the overall error value to the calibration output, or (2) subtracting the reference output from both sides so that the overall error value is equated to the calibration output minus the reference output. The nominal weight values of the calibration output and the reference output can cancel out (e.g., because the nominal weight of the reference output is configured to match a nominal weight of the calibration output) so that the remaining equation shows the cell error values of the calibration output minus the cell error values of the reference output equaling the overall error value. In this example, a solution of the system of equations can produce cell error values that result in a more linear DAC. However, the calibration may be a relative calibration rather than an absolute calibration (e.g., because there is no reference cell 210 to provide an absolute reference).

Figure 8:
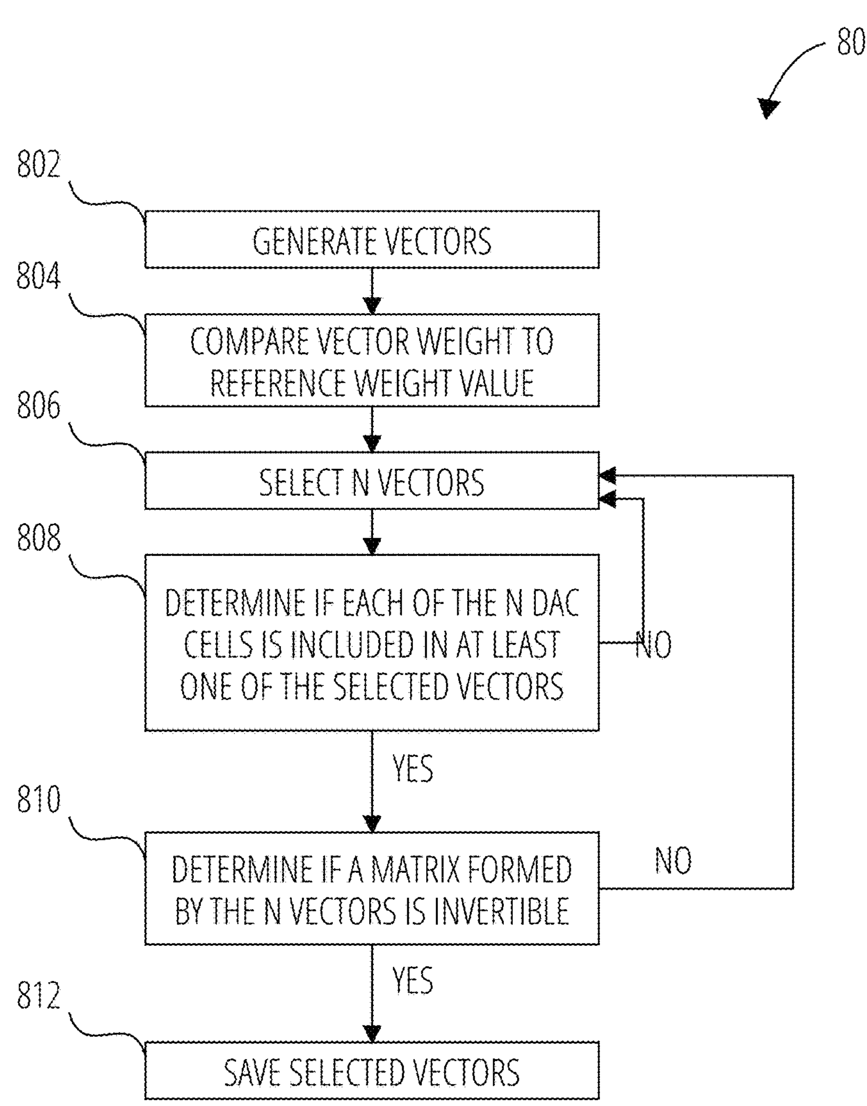
FIG. 8 shows an example of portions of a method for generating a set of calibration outputs.

FIG. 8 shows an example of portions of a method 800 for generating a set of calibration outputs (e.g., calibration output vectors, which can be included in a square matrix 320), such as can be performed on a computer (e.g., using MATLAB). At step 802, a number of vectors can be generated, such as can include randomly generated. In an example, all possible vector combinations of the DAC cells 220 can be generated (e.g., all combinations of the 14 DAC cells of FIG. 3A).

At step 804, the weight (e.g., nominal weight) of one or more of the N vectors can be compared to the reference weight value. Vectors with a weight matching the reference weight value can be selected, recorded, or otherwise marked. In an example, vectors with a weight not matching the reference weight can be discarded.

At step 806, N vectors can be selected from the vectors that have a weight matching the reference weight value, where N is the number of DAC cells to be calibrated. The N vectors can be selected randomly.

At step 808, it can be determined if each of the N DAC cells are include in at least one of the selected vectors. If so, the method can include advancing to step 810. If not, the method can include returning to step 806. At step 806, N new vectors can be selected, or one or more of the selected vectors can be replaced with another vector.

At step 810, it can be determined if a matrix (e.g., the square matrix 320) formed by the N vectors is invertible (e.g., if the system of equations formed using the N vectors will be solvable). If so, the method can include saving the selected vectors at step 812, such as for use in calibrating a DAC. If not, the method can include returning to step 806. At step 806, N new vectors can be selected, or one or more of the selected vectors can be replaced with another vector.

The method 800 can be performed prior to runtime, such as during a configuration of a DAC calibration system 200 or DAC. If it is determined that no solvable systems can be generated, the method 800 can include adding a DAC cell, such as a DAC cell matching a weight value of another DAC cell, and re-searching for a solvable system.

The shown order of steps is not intended to be a limitation on the order in which the steps are performed. In an example, two or more steps may be performed simultaneously or at least partially concurrently.

Figure 9:
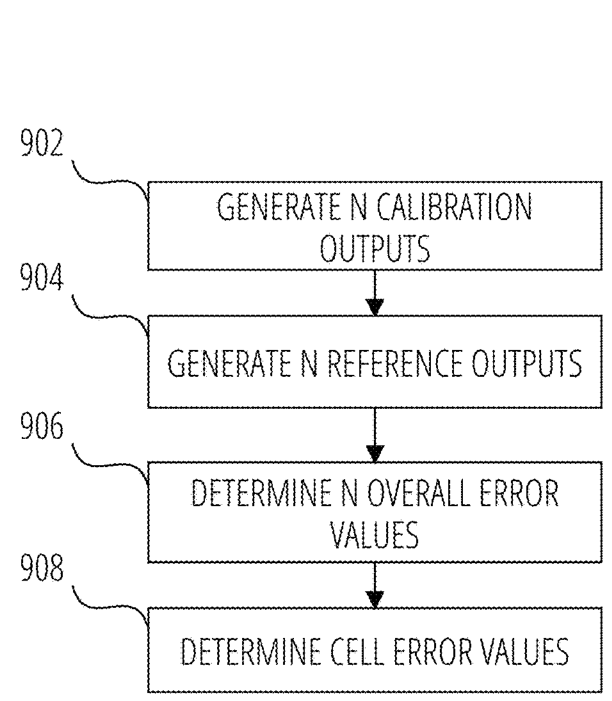
FIG. 9 shows an example of portions of a method for operating portions of a DAC calibration system.

FIG. 9 shows an example of portions of a method 900 for operating portions of a DAC calibration system, such as the DAC calibration system 200. The method 900 can be a method of calibrating N digital-to-analog converter (DAC) cells in a DAC, where N can be an integer number of DAC cells greater than or equal to 2. At step 902, N calibration outputs can be generated, such as using the DAC. In an example, each of the N calibration outputs can be generated using a distinct combination of DAC cells. In an example, each of the N DAC cells can be used in at least one of the N calibration outputs. Individual ones of the N reference outputs can be configured to have a specified reference weight value.

At step 904, N reference outputs can be generated, such as using the DAC.

At step 906, N overall error values can be determined corresponding to a difference between respective individual ones of the N calibration outputs and the N reference outputs. For example, a first calibration output (e.g., generated at step 902) can be compared to a first reference output (e.g., generated at step 904) to determine a first overall error value (e.g., at step 906). This can comprise a first calibration test. A similar calibration test can be performed for the remaining of the N calibration tests.

At step 908, a cell error value for each of the N DAC cells can be determined using the N overall error values. In an example, each of the N DAC cells can be adjusted based on the determined respective cell error values.

In an example, this can include one or more of describing each of the distinct combinations of DAC cells as a vector, generating a square matrix comprising the N distinct vectors, or generating an error vector including the N overall error values. A solution vector including the cell error value for each of the N DAC cells can be generated, such as by inverting the square matrix, multiplying the inverse of the square matrix by the error vector to generate the solution vector, or both.

In an example, the method 900 can include pre-selecting the distinct combinations of DAC cells such that a resulting square matrix is invertible. For example, the square matrix 320 can be selected using the method 800.

The shown order of steps is not intended to be a limitation on the order in which the steps are performed. In an example, two or more steps may be performed simultaneously or at least partially concurrently.

Figure 10:
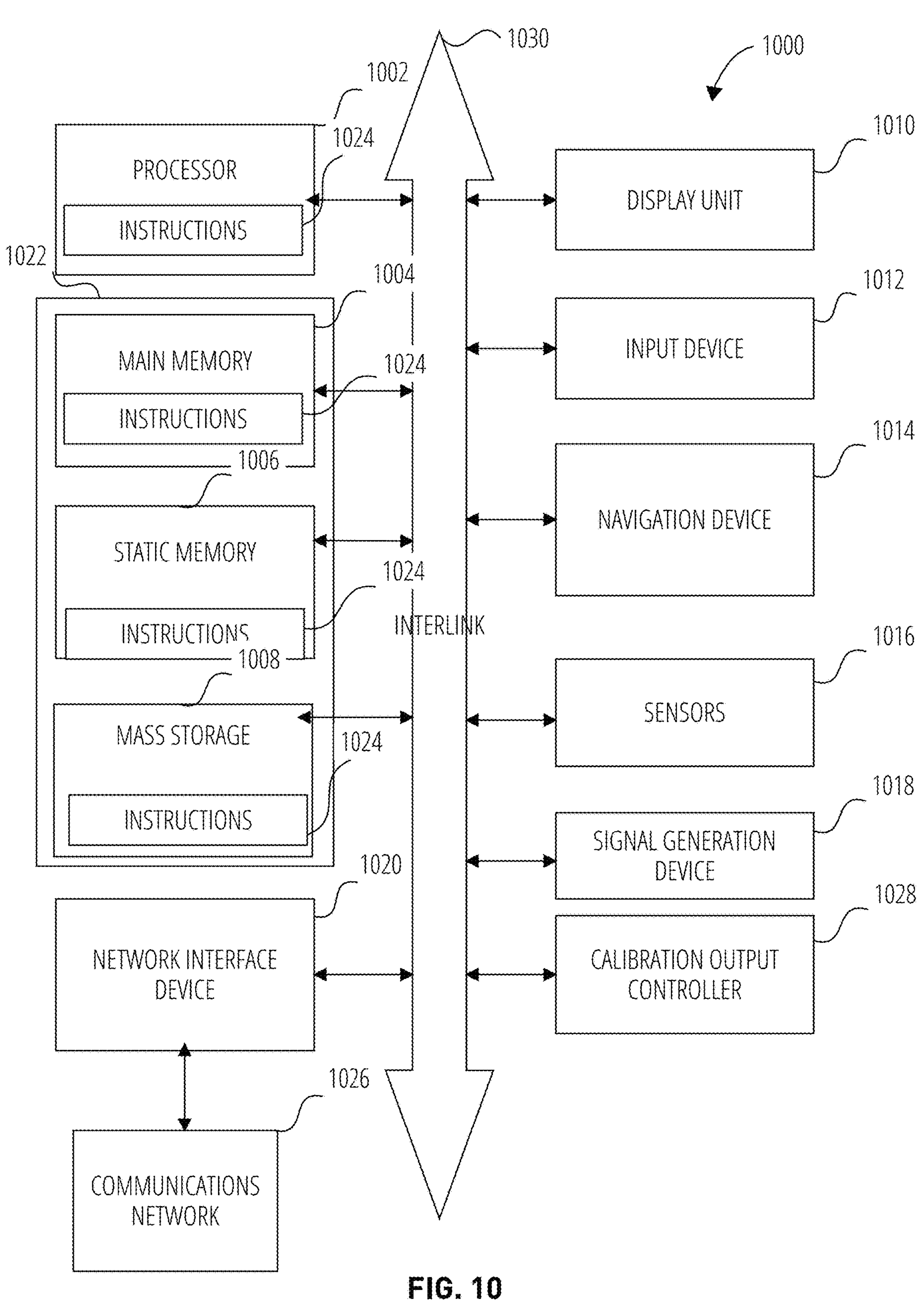
FIG. 10 is a block diagram illustrating an example of portions of a machine upon which one or more portions of the present disclosure may be implemented.

FIG. 10 illustrates a block diagram of an example machine 1000 upon which any one or more of the techniques (e.g., methodologies) discussed herein may be implemented. Examples, as described herein, may include, or may operate by, logic or a number of components, or mechanisms in the machine 1000. Circuitry (e.g., processing circuitry) is a collection of circuits implemented in tangible entities of the machine 1000 that include hardware (e.g., simple circuits, gates, logic, etc.). Circuitry membership may be flexible over time. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a machine readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine readable medium elements are part of the circuitry or are communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time. Additional examples of these components with respect to the machine 1000 follow.

In alternative examples, the machine 1000 may operate as a standalone device or may be connected (e.g., networked) to other machines. In a networked deployment, the machine 1000 may operate in the capacity of a server machine, a client machine, or both in server-client network environments. In an example, the machine 1000 may act as a peer machine in peer-to-peer (P2P) (or other distributed) network environment. The machine 1000 may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine 1000 may include a hardware processor 1002 (e.g., a central processing unit (CPU), a graphics processing unit (GPU), a hardware processor core, or any combination thereof), a main memory 1004, a static memory (e.g., memory or storage for firmware, microcode, a basic-input-calibration output (BIOS), and mass storage 1008 (e.g., hard drives, tape drives, flash storage, or other block devices) some or all of which may communicate with each other via an interlink 1030 (e.g., bus). The machine 1000 may further include a display unit 1010, an alphanumeric input device 1012 (e.g., a keyboard), and a user interface (UI) navigation device 1014 (e.g., a mouse). In an example, the display unit 1010, input device 1012 and UI navigation device 1014 may be a touch screen display. The machine 1000 may additionally include a signal generation device 1018 (e.g., a speaker), a network interface device 1020, and one or more sensors 1016, such as a global positioning system (GPS) sensor, compass, accelerometer, or other sensor. The machine 1000 may include a calibration output controller 1028, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the processor 1002, the main memory 1004, the static memory 1006, or the mass storage 1008 may be, or include, a machine readable medium 1022 on which is stored one or more sets of data structures or instructions 1024 (e.g., software) embodying or utilized by any one or more of the techniques or functions described herein. The instructions 1024 may also reside, completely or at least partially, within any of registers of the processor 1002, the main memory 1004, the static memory 1006, or the mass storage 1008 during execution thereof by the machine 1000. In an example, one or any combination of the hardware processor 1002, the main memory 1004, the static memory 1006, or the mass storage 1008 may constitute the machine readable media 1022. While the machine readable medium 1022 is illustrated as a single medium, the term "machine readable medium" may include a single medium or multiple media (e.g., a centralized or distributed database, and/or associated caches and servers) configured to store the one or more instructions 1024.

The term "machine readable medium" may include any medium that is capable of storing, encoding, or carrying instructions for execution by the machine 1000 and that cause the machine 1000 to perform any one or more of the techniques of the present disclosure, or that is capable of storing, encoding or carrying data structures used by or associated with such instructions. Non-limiting machine readable medium examples may include solid-state memories, optical media, magnetic media, and signals (e.g., radio frequency signals, other photon based signals, sound signals, etc.). In an example, a non-transitory machine readable medium comprises a machine readable medium with a plurality of particles having invariant (e.g., rest) mass, and thus are compositions of matter. Accordingly, non-transitory machine-readable media are machine readable media that do not include transitory propagating signals. Specific examples of non-transitory machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

In an example, information stored or otherwise provided on the machine readable medium 1022 may be representative of the instructions 1024, such as instructions 1024 themselves or a format from which the instructions 1024 may be derived. This format from which the instructions 1024 may be derived may include source code, encoded instructions (e.g., in compressed or encrypted form), packaged instructions (e.g., split into multiple packages), or the like. The information representative of the instructions 1024 in the machine readable medium 1022 may be processed by processing circuitry into the instructions to implement any of the operations discussed herein. For example, deriving the instructions 1024 from the information (e.g., processing by the processing circuitry) may include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions 1024.

In an example, the derivation of the instructions 1024 may include assembly, compilation, or interpretation of the information (e.g., by the processing circuitry) to create the instructions 1024 from some intermediate or preprocessed format provided by the machine readable medium 1022. The information, when provided in multiple parts, may be combined, unpacked, and modified to create the instructions 1024. For example, the information may be in multiple compressed source code packages (or object code, or binary executable code, etc.) on one or several remote servers. The source code packages may be encrypted when in transit over a network and decrypted, uncompressed, assembled (e.g., linked) if necessary, and compiled or interpreted (e.g., into a library, stand-alone executable etc.) at a local machine, and executed by the local machine.

The instructions 1024 may be further transmitted or received over a communications network 1026 using a transmission medium via the network interface device 1020 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), LoRa/LoRaWAN, or satellite communication networks, mobile telephone networks (e.g., cellular networks such as those complying with 3G, 4G LTE/LTE-A, or 5G standards), Plain Old Telephone (POTS) networks, and wireless data networks (e.g., Institute of Electrical and Electronics Engineers (IEEE) 802.11 family of standards known as Wi-Fi®, IEEE 802.15.4 family of standards, peer-to-peer (P2P) networks, among others. In an example, the network interface device 1020 may include one or more physical jacks (e.g., Ethernet, coaxial, or phone jacks) or one or more antennas to connect to the communications network 1026. In an example, the network interface device 1020 may include a plurality of antennas to wirelessly communicate using at least one of single-input multiple-calibration output (SIMO), multiple-input multiple-calibration output (MIMO), or multiple-input single-calibration output (MISO) techniques. The term "transmission medium" shall be taken to include any intangible medium that is capable of storing, encoding or carrying instructions for execution by the machine 1000, and includes digital or analog communications signals or other intangible medium to facilitate communication of such software. A transmission medium is a machine-readable medium.

This disclosure is believed to apply to any combination or permutation of DAC configuration (e.g., current DAC, voltage DAC, segmented DACs, current steering DACs, sigma-delta DACs). In addition, this disclosure is believed to apply to any method of generating equations describing the relations of various DAC cells, any method of solving a system of equations, or both.

The following, non-limiting examples, detail certain aspects of the present subject matter to solve the challenges and provide the benefits discussed herein, among others.

EXAMPLES

Example 1 is a digital-to-analog converter (DAC) calibration system for calibrating N DAC cells in a DAC, where N is an integer number of DAC cells greater than 2, the DAC calibration system comprising: a processor, configured to: configure the DAC to generate N reference outputs; configure the DAC to generate N calibration outputs; determine N overall error values corresponding to a difference between respective individual ones of the N calibration outputs and the N reference outputs; and determine, using the N overall error values, a cell error value for each of the N DAC cells.

In Example 2, the subject matter of Example 1 optionally includes a reference cell, configured to provide a specified reference weight value, wherein the reference cell generates the N reference outputs; and wherein the N overall error values correspond to a difference between respective individual ones of the N calibration outputs and the specified reference weight value.

In Example 3, the subject matter of Example 2 optionally includes wherein: each of the N calibration outputs are generated using a distinct combination of DAC cells, wherein each of the N DAC cells are used in at least one of the N calibration outputs.

In Example 4, the subject matter of Example 3 optionally includes wherein: each of the N calibration outputs of the DAC are configured to have a same weight value, wherein the weight value of each of the N calibration outputs are configured to match the reference weight value.

In Example 5, the subject matter of Example 4 optionally includes wherein: the overall error value of a calibration output corresponds to a sum of the cell error values for the DAC cells that are used to generate the calibration output.

In Example 6, the subject matter of any one or more of Examples 4-5 optionally include wherein: each of the N overall error values and the cell error values making up the corresponding ones of the N overall error values comprise a linear equation; and determining the cell error value for each of the N DAC cells includes solving a system of N linear equations.

In Example 7, the subject matter of Example 6 optionally includes wherein: the DAC cells comprising the N calibration outputs form N row vectors; the N row vectors form a square matrix; the N overall error values form an overall error column vector; determining the cell error value for each of the N DAC cells includes multiplying an inverse of the square matrix by the overall error column vector to generate a cell error column vector; and wherein respective values in the cell error column vector correspond to respective cell error values.

In Example 8, the subject matter of any one or more of Examples 2-7 optionally include a comparator, configured to compare the reference cell output to a calibration output of the DAC; and adjustment circuitry, configured to adjust at least one of the reference weight value or a weight value of a DAC cell.

In Example 9, the subject matter of Example 8 optionally includes wherein the processor is configured to determine the N overall error values by: adjusting the adjustment circuitry until an adjustment value at which a state of the comparator changes is found.

In Example 10, the subject matter of Example 9 optionally includes wherein: the processor adjusts the adjustment circuitry using a binary search algorithm.

In Example 11, the subject matter of any one or more of Examples 2-10 optionally include wherein the processor is configured to: determine a second cell error value for each of the N DAC cells using a second set of N calibration outputs, wherein the second set of N calibration outputs are generated using a second set of combinations of DAC cells that are distinct from a first set of combinations of DAC cells used for generating the N calibration outputs; and determine an updated cell error value for each of the N DAC cells using the cell error value and the second cell error value.

In Example 12, the subject matter of Example 11 optionally includes wherein: to determine an updated cell error value includes determining a central tendency of the second cell error value and the cell error value.

In Example 13, the subject matter of any one or more of Examples 1-12 optionally include wherein the processor is configured to: adjust each of the N DAC cells based on the determined respective cell error values.

Example 14 is a method of calibrating N digital-to-analog converter (DAC) cells in a DAC, where N is an integer number of DAC cells greater than 2, the method comprising: generating N calibration outputs using the DAC; generating N reference outputs using the DAC; determining N overall error values corresponding to a difference between respective individual ones of the N calibration outputs and the N reference outputs; and determining, using the N overall error values, a cell error value for each of the N DAC cells.

In Example 15, the subject matter of Example 14 optionally includes generating each of the N calibration outputs using a distinct combination of DAC cells; and using each of the N DAC cells in at least one of the N calibration outputs, wherein individual ones of the N reference outputs are configured to have a specified reference weight value.

In Example 16, the subject matter of Example 15 optionally includes describing each of the distinct combinations of DAC cells as a vector; generating a square matrix comprising N distinct vectors; and generating an error vector including the N overall error values.

In Example 17, the subject matter of Example 16 optionally includes generating a solution vector including the cell error value for each of the N DAC cells by: inverting the square matrix; and multiplying an inverse of the square matrix by the error vector to generate the solution vector.

In Example 18, the subject matter of Example 17 optionally includes pre-selecting the distinct combinations of DAC cells such that a resulting square matrix is invertible.

In Example 19, the subject matter of any one or more of Examples 14-18 optionally include adjusting each of the N DAC cells based on the determined respective cell error values.

Example 20 is a digital-to-analog converter (DAC) calibration system for calibrating N DAC cells in a DAC, where N is an integer number of DAC cells greater than 2, the DAC calibration system comprising: a processor, configured to: configure the DAC to generate N reference outputs; configure the DAC to generate N calibration outputs; determine N overall error values corresponding to a difference between respective individual ones of the N calibration outputs and the N reference outputs, wherein respective groups comprised of corresponding ones of the N reference outputs and N calibration outputs are generated using a distinct combination of DAC cells, wherein each of the N DAC cells are used in at least one of the N reference outputs or the N calibration outputs; and determine, using the N overall error values, a cell error value for each of the N DAC cells.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

Each of the non-limiting aspects above can stand on its own or can be combined in various permutations or combinations with one or more of the other aspects or other subject matter described in this document.

The above detailed description includes references to the accompanying drawings, which form a part of the detailed description. The drawings show, by way of illustration, specific examples that may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the terms "or" and "and/or" are used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The term "about," as used herein, means approximately, in the region of, roughly, or around. When the term "about" is used in conjunction with a numerical range, it modifies that range by extending the boundaries above and below the numerical values set forth. In general, the term "about" is used herein to modify a numerical value above and below the stated value by a variance of 10%. In one aspect, the term "about" means plus or minus 10% of the numerical value of the number with which it is being used. Therefore, about 50% means in the range of 45%-55%. Numerical ranges recited herein by endpoints include all numbers and fractions subsumed within that range (e.g., 1 to 5 includes 1, 1.5, 2, 2.75, 3, 3.90, 4, 4.24, and 5). Similarly, numerical ranges recited herein by endpoints include subranges subsumed within that range (e.g., 1 to 5 includes 1-1.5, 1.5-2, 2-2.75, 2.75-3, 3-3.90, 3.90-4, 4-4.24, 4.24-5, 2-5, 3-5, 1-4, and 2-4).

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Such instructions can be read and executed by one or more processors to enable performance of operations comprising a method, for example. The instructions are in any suitable form, such as but not limited to source code, compiled code, interpreted code, executable code, static code, dynamic code, and the like.

Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other examples may be used, such as by one of ordinary skill in the art upon reviewing the above description. The Abstract is to allow the reader to quickly ascertain the nature of the technical disclosure and is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the examples should be determined with reference to the appended claims, along with the full scope of equivalents to which such claims are entitled.

What is claimed is:

1. A digital-to-analog converter (DAC) calibration system for calibrating N DAC cells in a DAC, where N is an integer number of DAC cells greater than 2, the DAC calibration system comprising:

a processor, configured to:

configure the DAC to generate N reference outputs;

configure the DAC to generate N calibration outputs, wherein at least one of the N calibration outputs is generated by two or more of the DAC cells;

determine N overall error values corresponding to a difference between respective individual ones of the N calibration outputs and the N reference outputs; and determine, using the N overall error values, a cell error value for each of the N DAC cells.

2. The DAC calibration system of claim 1, comprising:

a reference cell, configured to provide a specified reference weight value, wherein the reference cell generates the N reference outputs; and wherein the N overall error values correspond to a difference between respective individual ones of the N calibration outputs and the specified reference weight value.

3. The DAC calibration system of claim 2, wherein:

each of the N calibration outputs are generated using a distinct combination of DAC cells, wherein each of the N DAC cells are used in at least one of the N calibration outputs.

4. The DAC calibration system of claim 3, wherein:

each of the N calibration outputs of the DAC are configured to have a same weight value, wherein the weight value of each of the N calibration outputs are configured to match the reference weight value.

5. The DAC calibration system of claim 4, wherein:

the overall error value of a calibration output corresponds to a sum of the cell error values for the DAC cells that are used to generate the calibration output.

6. The DAC calibration system of claim 4, wherein:

each of the N overall error values and the cell error values making up the corresponding ones of the N overall error values comprise a linear equation; and determining the cell error value for each of the N DAC cells includes solving a system of N linear equations.

7. The DAC calibration system of claim 6, wherein:

the DAC cells comprising the N calibration outputs form N row vectors;

the N row vectors form a square matrix;

the N overall error values form an overall error column vector;

determining the cell error value for each of the N DAC cells includes multiplying an inverse of the square matrix by the overall error column vector to generate a cell error column vector; and wherein respective values in the cell error column vector correspond to respective cell error values.

8. The DAC calibration system of claim 2, comprising:

a comparator, configured to compare the reference cell output to a calibration output of the DAC; and adjustment circuitry, configured to adjust at least one of the reference weight value or a weight value of a DAC cell.

9. The DAC calibration system of claim 8, wherein the processor is configured to determine the N overall error values by:

adjusting the adjustment circuitry until an adjustment value at which a state of the comparator changes is found.

10. The DAC calibration system of claim 9, wherein:

the processor adjusts the adjustment circuitry using a binary search algorithm.

11. The DAC calibration system of claim 2, wherein the processor is configured to:

determine a second cell error value for each of the N DAC cells using a second set of N calibration outputs, wherein the second set of N calibration outputs are generated using a second set of combinations of DAC cells that are distinct from a first set of combinations of DAC cells used for generating the N calibration outputs; and determine an updated cell error value for each of the N DAC cells using the cell error value and the second cell error value.

12. The DAC calibration system of claim 11, wherein:

to determine an updated cell error value includes determining a central tendency of the second cell error value and the cell error value.

13. The DAC calibration system of claim 1, wherein the processor is configured to:

adjust each of the N DAC cells based on the determined respective cell error values.

14. A method of calibrating N digital-to-analog converter (DAC) cells in a DAC, where N is an integer number of DAC cells greater than 2, the method comprising:

generating N calibration outputs using the DAC, wherein at least one of the N calibration outputs is generated by two or more of the DAC cells;

generating N reference outputs using the DAC;

determining N overall error values corresponding to a difference between respective individual ones of the N calibration outputs and the N reference outputs; and determining, using the N overall error values, a cell error value for each of the N DAC cells.

15. The method of claim 14, comprising:

generating each of the N calibration outputs using a distinct combination of DAC cells; and using each of the N DAC cells in at least one of the N calibration outputs, wherein individual ones of the N reference outputs are configured to have a specified reference weight value.

16. The method of claim 15, comprising:

describing each of the distinct combinations of DAC cells as a vector;

generating a square matrix comprising N distinct vectors; and generating an error vector including the N overall error values.

17. The method of claim 16, comprising:

generating a solution vector including the cell error value for each of the N DAC cells by:

inverting the square matrix; and multiplying an inverse of the square matrix by the error vector to generate the solution vector.

18. The method of claim 17, comprising:

pre-selecting the distinct combinations of DAC cells such that a resulting square matrix is invertible.

19. The method of claim 14, comprising:

adjusting each of the N DAC cells based on the determined respective cell error values.

20. A digital-to-analog converter (DAC) calibration system for calibrating N DAC cells in a DAC, where N is an integer number of DAC cells greater than 2, the DAC calibration system comprising:

a processor, configured to:

configure the DAC to generate N reference outputs;

configure the DAC to generate N calibration outputs;

determine N overall error values corresponding to a difference between respective individual ones of the N calibration outputs and the N reference outputs, wherein respective groups comprised of corresponding ones of the N reference outputs and N calibration outputs are generated using a distinct combination of DAC cells, wherein each of the N DAC cells are used in at least one of the N reference outputs or the N calibration outputs; and determine, using the N overall error values, a cell error value for each of the N DAC cells.

* * * * *